United States Patent
Chen et al.

(10) Patent No.: US 8,987,071 B2
(45) Date of Patent: Mar. 24, 2015

(54) THIN FILM TRANSISTOR AND FABRICATING METHOD

(71) Applicant: National Applied Research Laboratories, Taipei (TW)

(72) Inventors: Min-Cheng Chen, Taipei (TW); Chang-Hsien Lin, Taipei (TW); Chia-Yi Lin, Taipei (TW); Tung-Yen Lai, Taipei (TW); Chia-Hua Ho, Taipei (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 14/107,742

(22) Filed: Dec. 16, 2013

(65) Prior Publication Data
US 2014/0099756 A1 Apr. 10, 2014

Related U.S. Application Data

(63) Continuation-in-part of application No. 13/451,390, filed on Apr. 19, 2012.

(30) Foreign Application Priority Data

Dec. 21, 2011 (TW) .............................. 100147632 A (51) Int. Cl.
| | | |
|---|---|---|
| H01L 27/12 | (2006.01) | |
| H01L 29/06 | (2006.01) | |
| B82Y 10/00 | (2011.01) | |
| H01L 27/06 | (2006.01) | |
| H01L 21/84 | (2006.01) | |

(Continued)

(52) U.S. Cl.
CPC .............. *H01L 27/127* (2013.01); *H01L 21/84* (2013.01); *H01L 29/0665* (2013.01); *B82Y 10/00* (2013.01); *H01L 27/1203* (2013.01); *H01L 27/0688* (2013.01); *H01L 21/8238* (2013.01); *H01L 27/092* (2013.01); *H01L 29/0676* (2013.01)
USPC ........... 438/154; 438/269; 438/486; 438/682; 438/151; 257/24; 257/347; 257/E21.704; 257/E29.255; 257/E29.245

(58) Field of Classification Search
CPC . H01L 21/02603; H01L 21/84; H01L 29/413; H01L 29/0665
USPC .................................. 438/154, 269, 486, 682
See application file for complete search history.

(56) References Cited

U.S. PATENT DOCUMENTS 5,905,306 A * 5/1999 Cheng et al. ................... 257/734

(Continued)

*Primary Examiner* — Julia Slutsker
*Assistant Examiner* — Natalia Gondarenko
(74) *Attorney, Agent, or Firm* — Ditthavong & Steiner, P.C.

(57) ABSTRACT

A thin-film transistor comprises a semiconductor panel, a dielectric layer, a semiconductor film layer, a conduct layer, a source and a drain. The semiconductor panel comprises a base, an intra-dielectric layer, at least one metal wire layer and at least one via layer. The dielectric layer is stacked on the semiconductor panel. The semiconductor film layer is stacked on the dielectric layer. The conduct layer is formed on the semiconductor film layer. The source is formed on the via of the vias that is adjacent to and connects to the gate via. The drain is formed on another via of the vias that is adjacent to and connects to the gate via. A fabricating method for a thin-film transistor with metal-gates and nano-wires is also disclosed.

20 Claims, 14 Drawing Sheets

(51) Int. Cl.
*H01L 21/8238* (2006.01)
*H01L 27/092* (2006.01)

(56) References Cited

U.S. PATENT DOCUMENTS

| | | | |
|---|---|---|---|
| 2005/0179964 A1* | 8/2005 | Izumi | 358/483 |
| 2007/0037411 A1* | 2/2007 | Balkenende et al. | 438/781 |
| 2008/0246158 A1* | 10/2008 | Mascolo et al. | 257/773 |
| 2008/0293246 A1* | 11/2008 | Cohen et al. | 438/682 |
| 2009/0278134 A1* | 11/2009 | Ohmi et al. | 257/72 |
| 2010/0012943 A1* | 1/2010 | Park et al. | 257/66 |
| 2010/0184281 A1* | 7/2010 | Hsu et al. | 438/591 |
| 2011/0062421 A1* | 3/2011 | Iwayama et al. | 257/29 |

* cited by examiner

THIN FILM TRANSISTOR AND FABRICATING METHOD

CROSS-REFERENCE TO RELATED APPLICATION

This application is a continuation-in-part (CIP) of an U.S. application with application Ser. No. 13/451,390, filed on Apr. 19, 2012, which further claims priority from application No. 100147632, filed on Dec. 21, 2011 in the Taiwan Intellectual Property Office.

FIELD OF THE INVENTION

The present invention is a thin film transistor and fabricating method.

BACKGROUND OF THE INVENTION

Recently, single-chips have been developed using a complementary metal-oxide-semiconductor (CMOS) process and has been applied in an element array. To increase density of the element array, the CMOS process needs to be reduced by using nanoscale CMOS devices. However, how to fabricate nanoscale CMOS devices and parasitic resistances effect are problems.

U.S. Patent No. 2005/0176226 A1 discloses a method of manufacturing an electronic device comprising a bottom-gate TFT. The method comprises steps of: forming a doped amorphous silicon gate layer on a substrate with the gate layer defining a gate, forming a gate insulating layer over the gate, forming an amorphous silicon active layer over the gate insulating layer and overlying at least part of the gate and annealing the amorphous silicon active layer to form a polysilicon active layer. A thinner gate insulating layer can be used giving a TFT having a low threshold voltage. However, the electronic device has a device size that is hard to make smaller.

U.S. Patent No. 2008/0293246 A1 discloses a vertical FET structure with nanowires forming the FET channels. The nanowires are formed over a conductive silicide layer. The nanowires are gated by a surrounding gate. Top and bottom insulator plugs function as gate spacers and reduce the gate-source and gate-drain capacitance. However, the vertical FET structure requires six photomasks to be fabricated.

U.S. Patent No. 2010/0330759 discloses a method of forming a transistor comprising a transistor body, a surrounding gate insulator, a surrounding gate and an element characteristic. According to an embodiment of the method, a pillar of amorphous semiconductor material is formed on a crystalline substrate, and a solid phase epitaxy process is performed to crystallize the amorphous semiconductor material using the crystalline substrate to seed the crystalline growth. The pillar has a sublithographic thickness. The transistor body is formed in the crystallized semiconductor pillar between a first source/drain region and a second source/drain region. The surrounding gate insulator is formed around the semiconductor pillar, and the surrounding gate is formed around and separated from the semiconductor pillar by the surrounding gate insulator. Other aspects are provided. The element characteristic is easily affected by a complicated gate structure process.

U.S. Patent No. 2009/0065852 A1 discloses a nonvolatile memory device with a nanowire channel and a method for fabricating the same is proposed, in which side etching is used to shrink side walls of a side-gate to form a nanowire pattern, thereby fabricating a nanowire channel on the dielectric of the side walls of the side-gate. The nonvolatile memory device with a nanowire channel and dual-gate control can thus be achieved. This nonvolatile memory device can enhance data writing and erasing efficiency, and also has a capability of low voltage operation. Moreover, through a process of low cost and easy steps, highly reproducible and mass producible fabrication of nanowire devices can be accomplished. However, the nonvolatile memory device requires an extra hard mask to form an insulating device nanowire. The side-gate is difficult to cover with a gate dielectric layer.

Accordingly, a new nanoscale CMOS device and a fabricating method are needed to overcome the foregoing problems.

SUMMARY OF THE INVENTION

A first objective of the present invention is to provide a nanoscale CMOS device and a fabricating method to reduce the device size, decrease the number of photomasks needed, have an element characteristic that is hardly affected by a complicated gate structure process and have a gate that is easy to be covered evenly by a gate dielectric layer.

A thin-film transistor in accordance with the present invention can reduce device size, decrease photomasks needed, has an element characteristic that is hardly affected by a complicated gate structure process, has a gate that is easy to be covered evenly by a gate dielectric layer and comprises a semiconductor panel, a dielectric layer, a semiconductor film layer, a conduct layer, a source and a drain.

The semiconductor panel comprises a base, an intra-dielectric layer, at least one metal wire layer and at least one via layer.

The intra-dielectric layer is stacked on the base.

The metal wire layer comprises a lowest metal wire layer and at least one metal wire that is separated by the intra-dielectric layer, of which one metal wire is a metal wire gate.

The via layer is stacked on the metal wire layer, of which one via layer has a groove and comprises at least one vias. Multiple vias are separated by intra-dielectric layers. Each via is stacked on one metal wire of the metal wires. One via of the vias is stacked on the metal wire gate is a gate via and comprises two nano-wire channels.

The dielectric layer is stacked on the semiconductor panel. The semiconductor film layer is stacked on the dielectric layer.

The conduct layer is formed on the semiconductor film layer.

The source is formed on one via of the vias that is adjacent to and connects to the gate via.

The drain is formed on another via of the vias that is adjacent to and connects to the gate via.

A fabricating method for a thin-film transistor in accordance with the present invention is used in a semiconductor panel consisting of a base, an intra-dielectric layer, at least one metal wire layer, at least one via layer and a surface. The intra-dielectric layer is stacked on the base. The metal wire layer comprises a lowest metal wire layer and at least one metal wire where multiple metal wires are separated by the intra-dielectric layer. The one metal wire of the metal wires is a metal wire gate. The via layer is stacked on the metal wire layer and comprises at least one via where multiple vias are separated by corresponding intra-dielectric layers. Each via is stacked on the one metal wire of the metal wires. One via of the vias is stacked on the metal wire gate is a gate via.

The fabricating method for a thin-film transistor comprises steps of grinding the surface of the semiconductor panel, etching one via layer of the via layers, stacking a dielectric layer on the semiconductor panel, stacking a semiconductor film layer on the dielectric layer, forming a conduct layer on the semiconductor film layer, defining a source zone and a drain zone on the one via of the vias that is adjacent to the gate via and connecting to the source zone, the drain zone and the gate via, forming a source and a drain and forming two nano-wire channels in the gate via and activating the conduct layer under the source and the drain.

DETAILED DESCRIPTION OF THE PRESENT INVENTION

With reference to FIGS. 1 and 6a to 6h, a thin-film transistor (1) in accordance with the present invention can reduce its device size, decrease photomasks needed, has an element characteristic that is not significantly affected by a complicated gate structure process, has a gate that is easy to be covered evenly by a gate dielectric layer and comprises a semiconductor panel (10), a dielectric layer (11), a semiconductor film layer (12), a conduct layer (13), a source (14) and a drain (15) and may have a threshold voltage. The semiconductor panel (10) comprises a base (100), an intra-dielectric layer (101), at least one metal wire layer (102) and at least one via layer (103).

Figure 1:
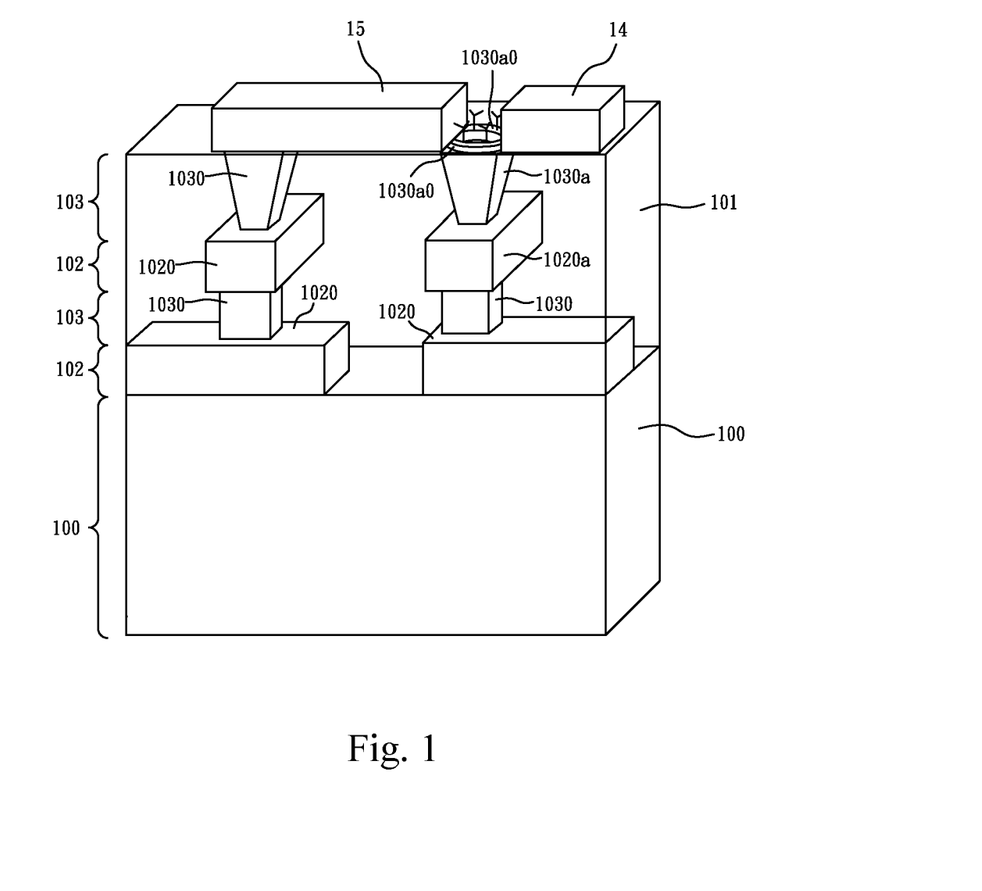
FIG. 1 is a first embodiment of a thin-film transistor in accordance with the present invention.
Figure 2:
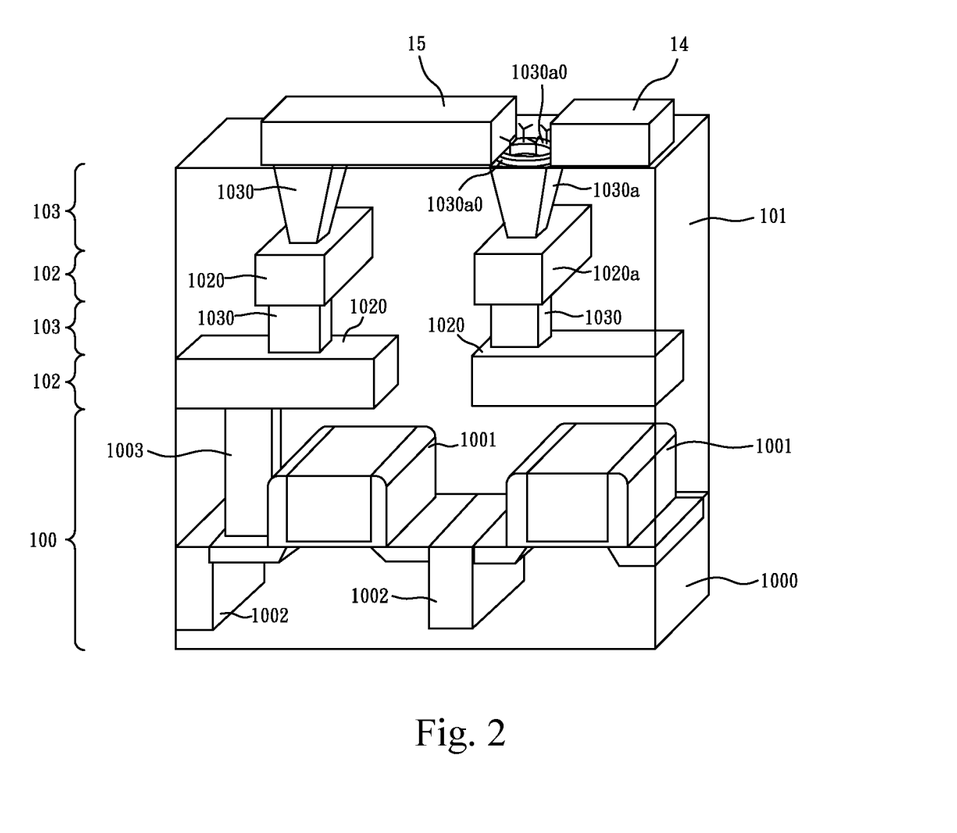
FIG. 2 is a second embodiment of the thin-film transistor in accordance with the present invention.

With further reference to FIG. 2, the base (100) may comprise at least one complementary metal-oxide-semiconductor well (1000), at least one poly-silicon thin film transistor (1001), at least one shallow trench isolation unit (1002) and at least one contact channel (1003). The poly-silicon thin film transistor (1001) is stacked on the complementary metal-oxide-semiconductor well (1000). The shallow trench isolation unit (1002) separates the multiple complementary metal-oxide-semiconductor wells (1000) and separates multiple poly-silicon thin film transistors (1001). The contact channel (1003) connects one poly-silicon thin film transistor (1001) of the poly-silicon thin film transistors (1001) and a lowest metal wire layer (102) of the metal wire layers (102).

The intra-dielectric layer (101) is stacked on the base (100).

The metal wire layer (102) comprises a lowest metal wire layer and at least one metal wire (1020) where multiple metal wires (1020) are separated by corresponding intra-dielectric layers (101), and one metal wire (1020) is a metal wire gate (1020a).

The via layer (103) is stacked on the metal wire layer (102), of which one via layer (103) has a groove, comprises at least one via (1030) and consists of tungsten, copper or aluminum. Multiple vias (1030) are separated by corresponding intra-dielectric layers (101). Each via (1030) is stacked on one metal wire (1020) of the metal wires (1020). One via (1030) of the vias (1030) is stacked on the metal wire gate (1020a) is a gate via (1030a) and comprises two nano-wire channels (1030a0). The nano-wire channels (1030a0) may be two spacer nano-wires.

The dielectric layer (11) is stacked on the semiconductor panel (10) and may be an oxide-nitride-oxide layer, an oxide layer, an oxide-nitride layer, a nitride layer or a high K layer.

The semiconductor film layer (12) is stacked on the dielectric layer (11) and may be a silicon film layer, a germanium film layer or a silicon-germanium film layer.

The conduct layer (13) is formed on the semiconductor film layer (12).

The source (14) is formed on one via (1030) of the vias (1030) that is adjacent to and connects to the gate via (1030a).

The drain (15) is formed on another via (1030) of the vias (1030) that is adjacent to and connects to the gate via (1030a).

Figure 3:
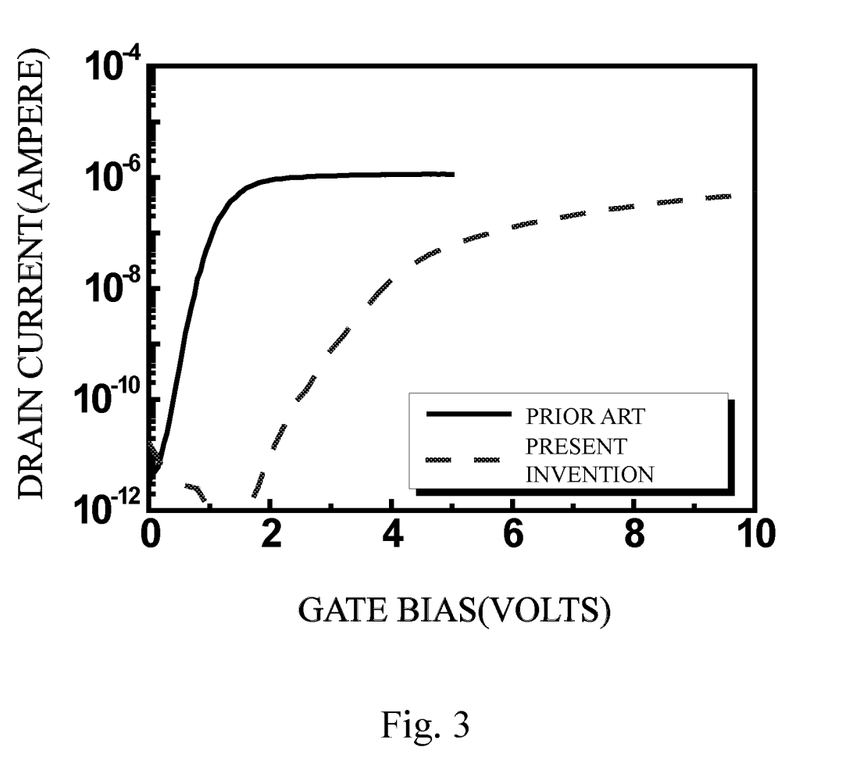
FIG. 3 is a graph of a drain current and a gate bias.
Figure 4:
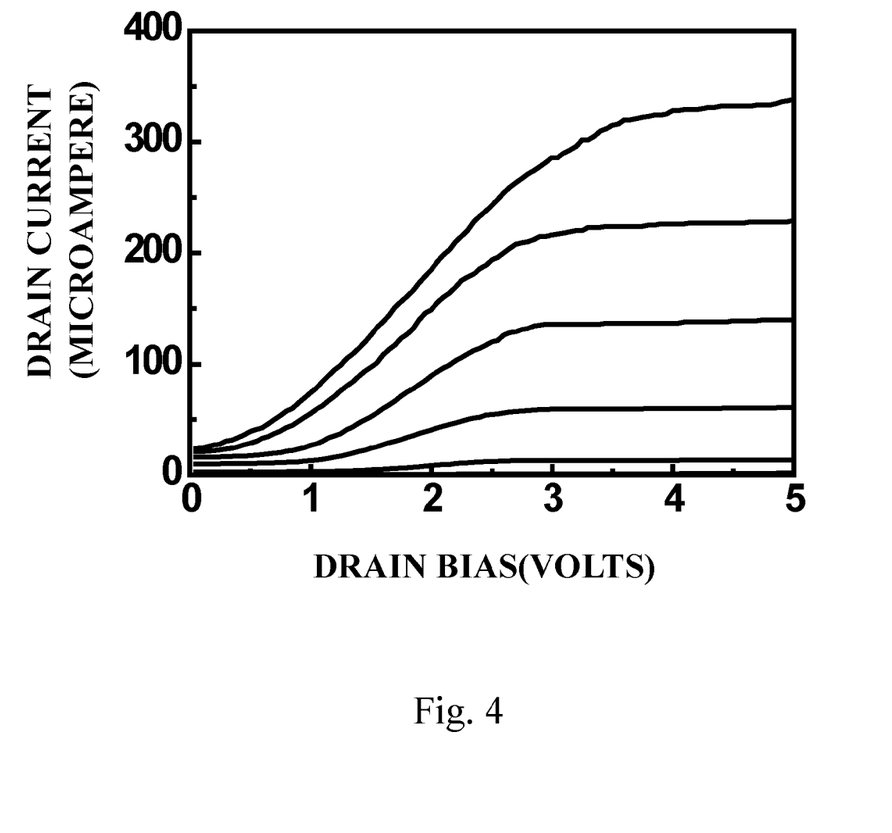
FIG. 4 is a graph of a drain current and a drain bias.

With further reference to FIGS. 3 and 4, a gate bias of the thin-film transistor with metal-gates and nano-wires (1) is greater than the threshold voltage and is 1 volt, 2 volts, 3 volts, 4 volts and 5 volts as shown in FIG. 4. Though the thin-film transistor (1) needs a bigger bias to work, the thin-film transistor (1) can be fabricated in a low temperature process.

Figure 5:
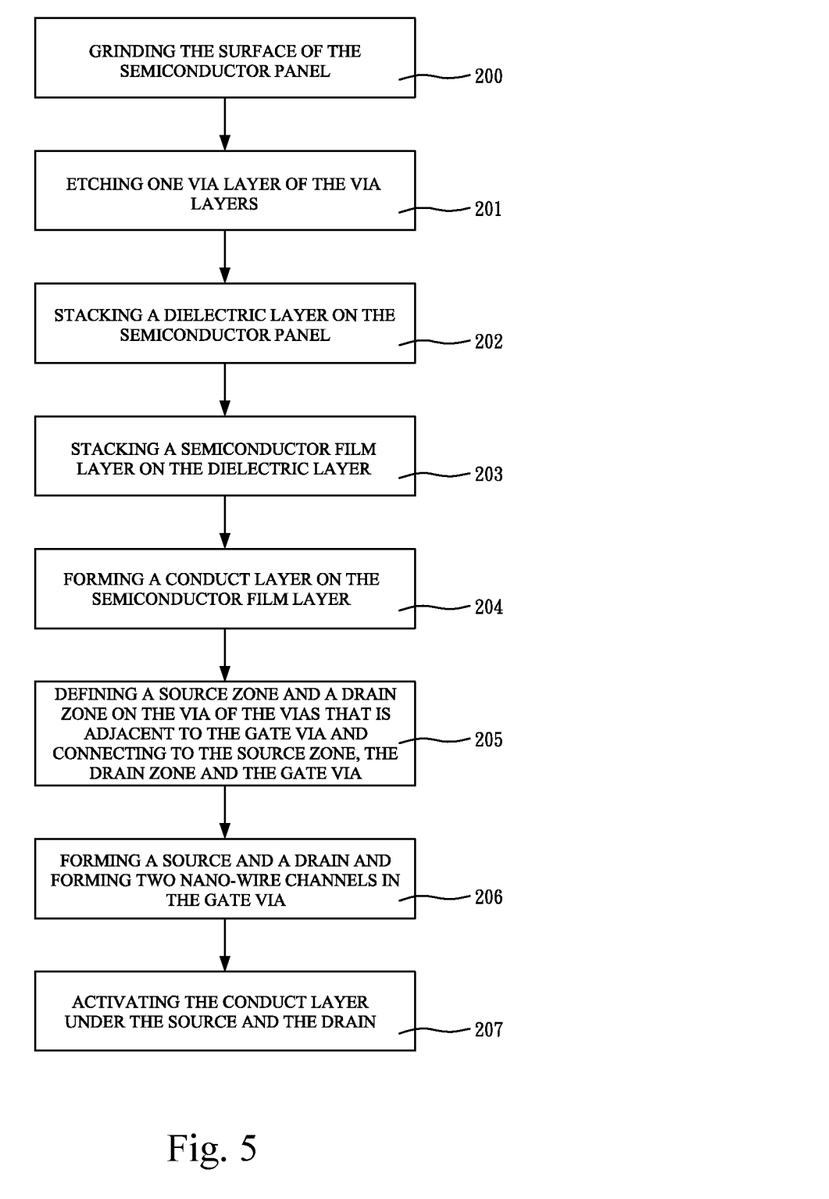
FIG. 5 is a flowchart of a fabricating method for a thin-film transistor in accordance with the present invention.

With further reference to FIG. 5, a fabricating method for a thin-film transistor (2) in accordance with the present invention is used in a semiconductor panel (10) consisting of a base (100), an intra-dielectric layer (101), at least one metal wire layer (102), at least one via layer (103) and a surface.

The intra-dielectric layer (101) is stacked on the base (10).

The metal wire layer (102) comprises a lowest metal wire layer (102) and at least one metal wire (1020) that is separated by the intra-dielectric layer (101). The one metal wire (1020) of the metal wires (1020) is a metal wire gate (1020a).

The via layer (103) is stacked on the metal wire layer (102) and comprises at least one via (1030) where multiple vias (1030) are separated by corresponding intra-dielectric layers (101). Each via (1030) is stacked on one metal wire (1020) of the metal wires (1020). One via (1030) of the vias (1030) stacked on the metal wire gate (1020a) is a gate via (1030a).

The fabricating method for a thin-film transistor (2) comprises steps of (200) grinding the surface of the semiconductor panel (10), (201) etching one via layer (103) of the via layers (103), (202) stacking a dielectric layer (11) on the semiconductor panel (10), (203) stacking a semiconductor film layer (12) on the dielectric layer (11), (204) forming a conduct layer (13) on the semiconductor film layer (12), (205) defining a source zone and a drain zone on the via (1030) of the vias (1030) that is adjacent to the gate via (1030a) and connecting to the source zone, the drain zone and the gate via (1030a), (206) forming a source (14) and a drain (15) and forming two nano-wire channels (1030a0) in the gate via (1030a) and (207) activating the conduct layer (13) under the source (14) and the drain (15).

Figure 6A:
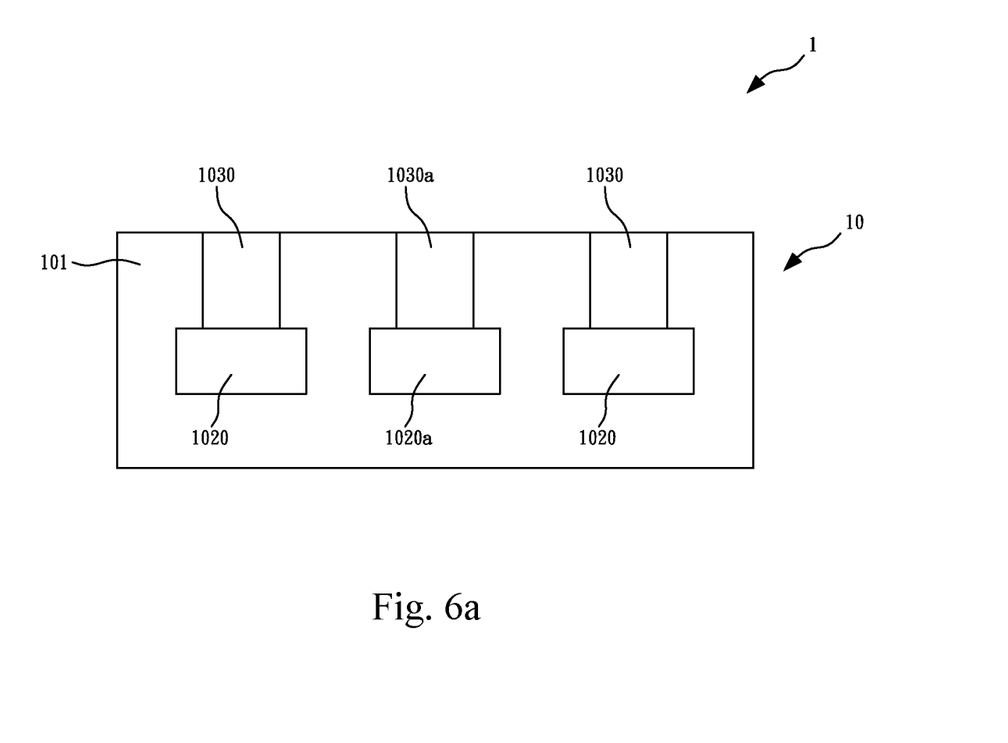
FIG. 6a is a perspective view of a step of grinding the surface of the semiconductor panel of the thin-film transistor in accordance with the present invention.

Step (200) of grinding the surface of the semiconductor panel (10) is performed by chemical mechanical polishing.

Figure 6B:
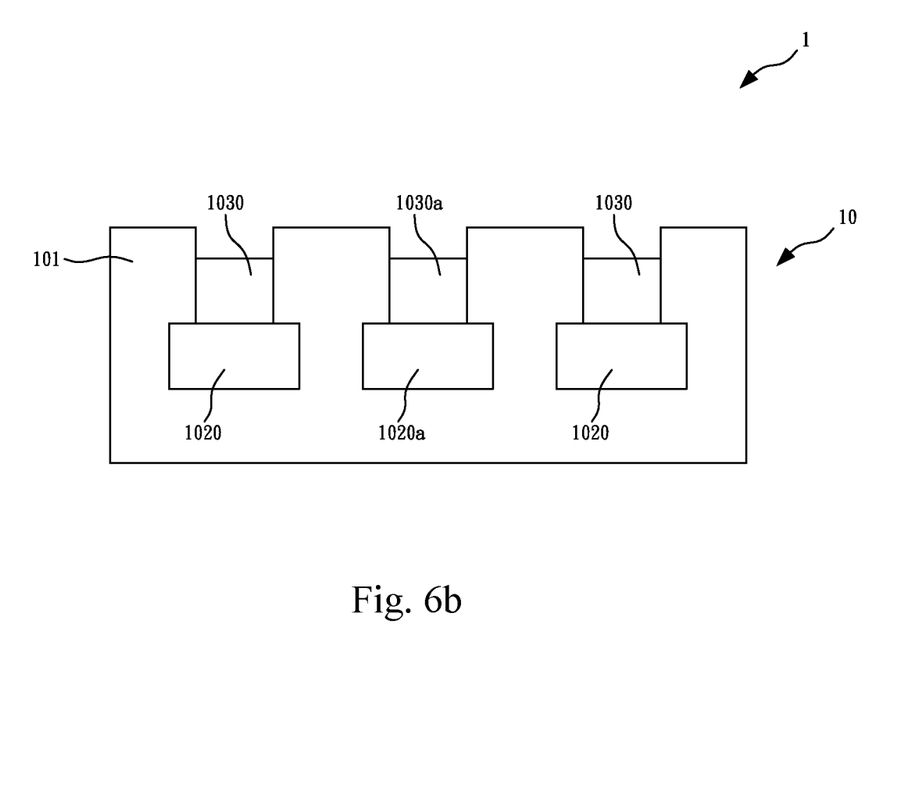
FIG. 6b is a perspective view of a step of etching one via layer of the via layers of the thin-film transistor in accordance with the present invention.

Step (201) of etching one via layer (103) of the via layers (103) etches one via layer (103) may be performed by over etching.

Figure 6C:
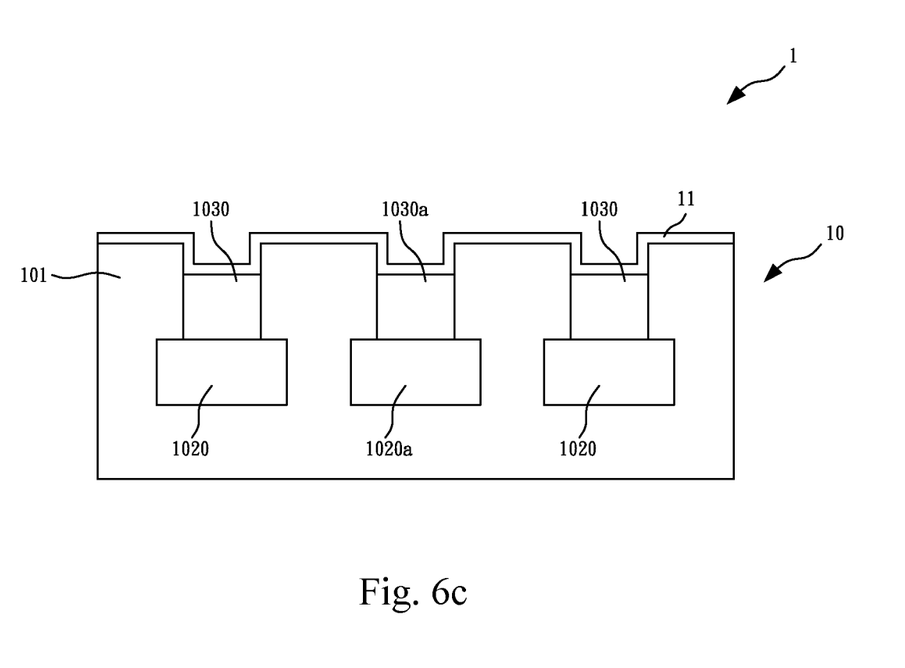
FIG. 6c is a perspective view of a step of stacking a dielectric layer on the semiconductor panel of the thin-film transistor in accordance with the present invention.

In step (202) of stacking a dielectric layer (11) on the semiconductor panel (10), the dielectric layer (11) may be an oxide-nitride-oxide layer, an oxide layer, an oxide-nitride layer, a nitride layer or a high K layer.

Figure 6D:
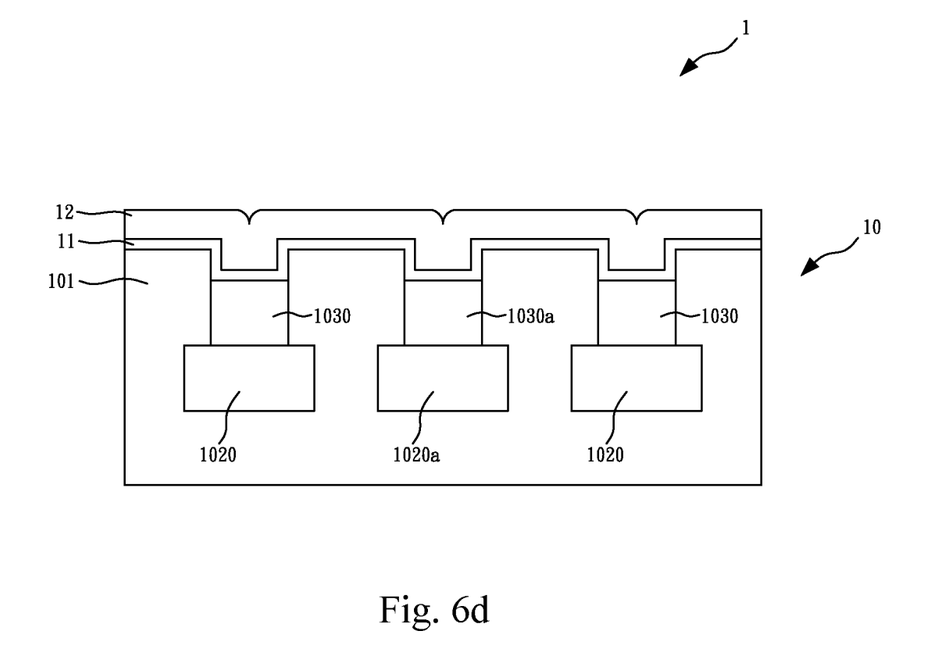
FIG. 6d is a perspective view of a step of stacking a semiconductor film layer on the dielectric layer of the thin-film transistor in accordance with the present invention.

Step (203) of stacking a semiconductor film layer (12) on the dielectric layer (11) may be performed by low temperature chemical vapor deposition or very high frequency plasma enhanced chemical vapor deposition (VHFPECVD). The semiconductor film layer (12) may be a group consisting of silicon film layer, germanium film layer or silicon-germanium film layer.

Figure 6E:
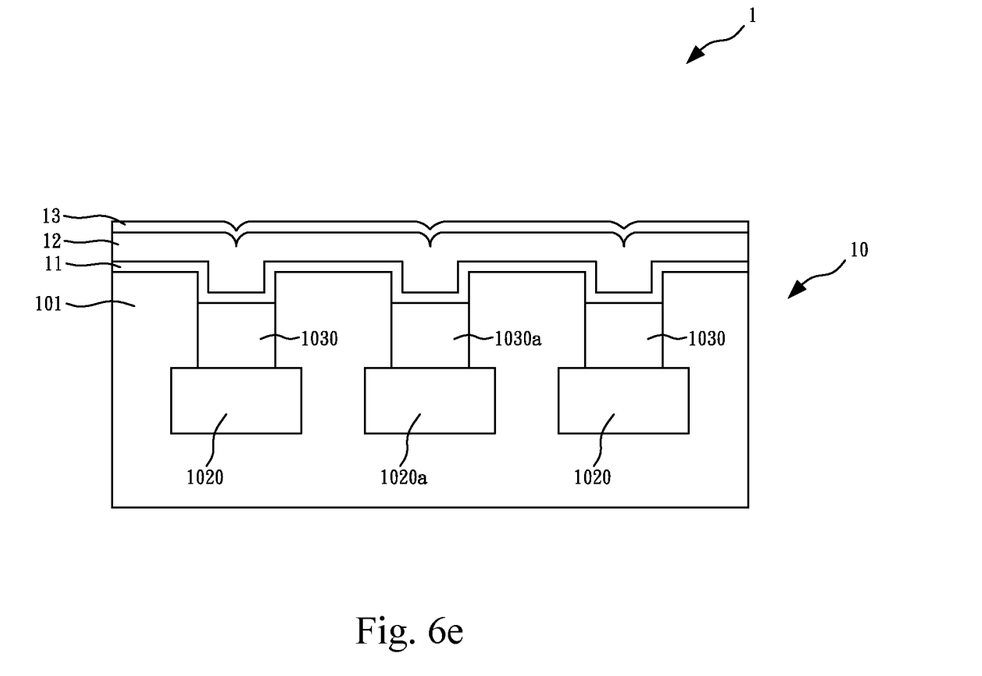
FIG. 6e is a perspective view of a step of forming a conduct layer on the semiconductor film layer of the thin-film transistor in accordance with the present invention.
Figure 6F:
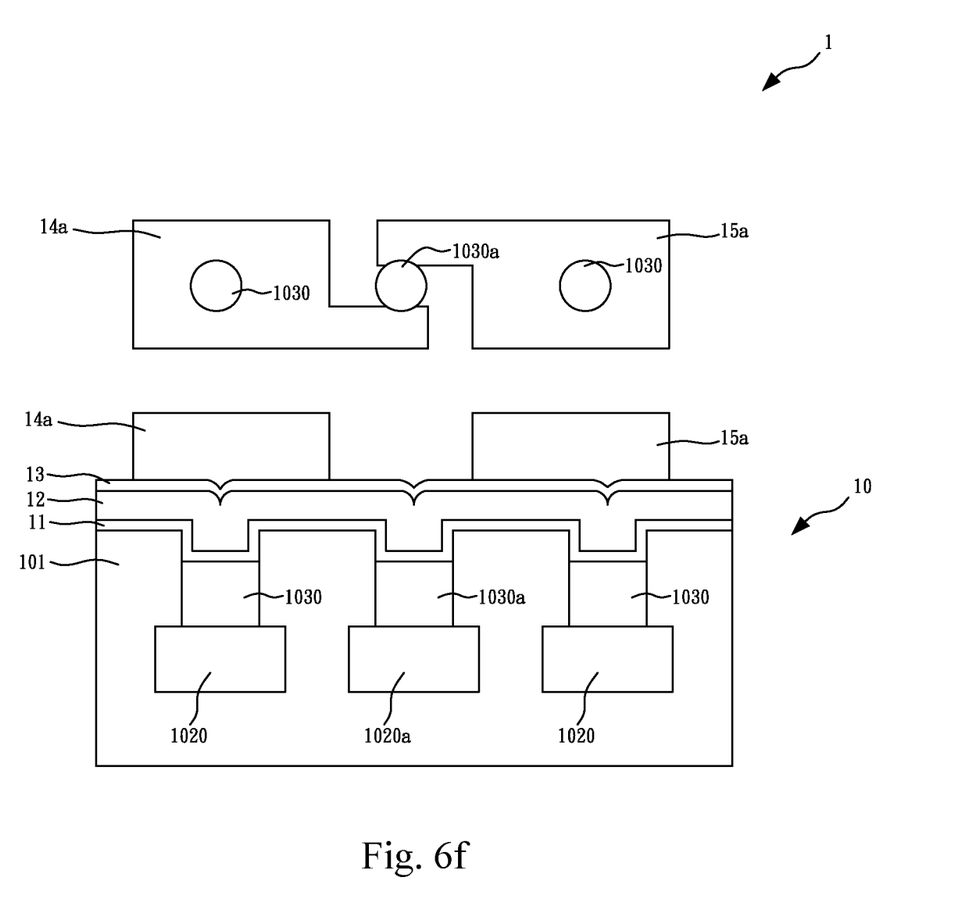
FIG. 6f is a perspective view of a step of defining a source zone and a drain zone on the via of the vias that is adjacent to the gate via and connecting to the source zone, the drain zone and the gate via of the thin-film transistor in accordance with the present invention.

Step (204) of forming a conduct layer (13) on the semiconductor film layer (12) may be achieved by ion dopant, depositing a silicide layer or in-situ doping.

Figure 6G:
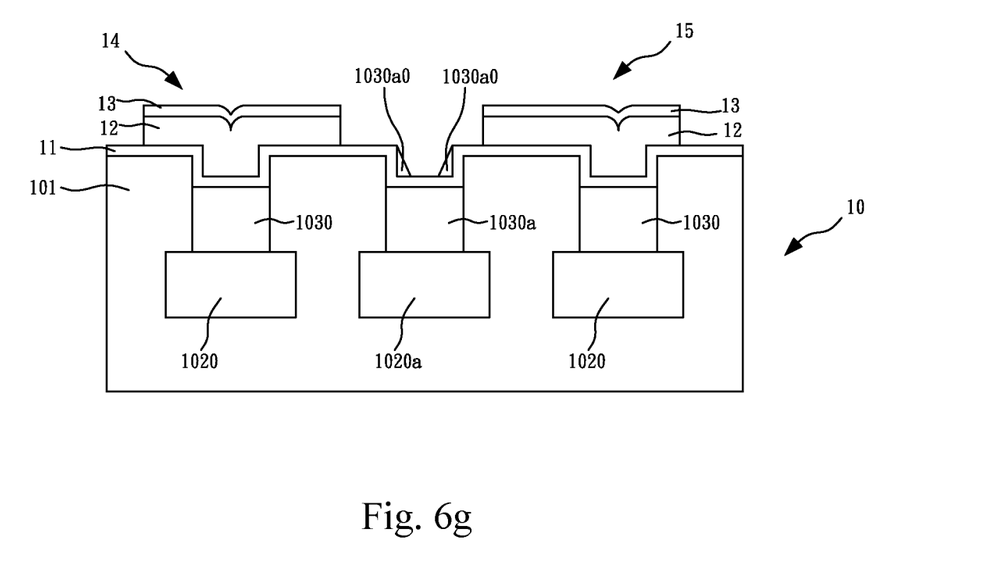
FIG. 6g is a perspective view of a step of forming a source and a drain and forming two nano-wire channels in the gate via of the thin-film transistor in accordance with the present invention.

Step (206) of forming a source (14) and a drain (15) and forming two nano-wire channels (1030a0) in the gate via (1030a) forms a source (14) and a drain (15) and forms two nano-wire channels (1030a0) may be formed by two spacer nanowires in the gate via through dry etching.

Figure 6H:
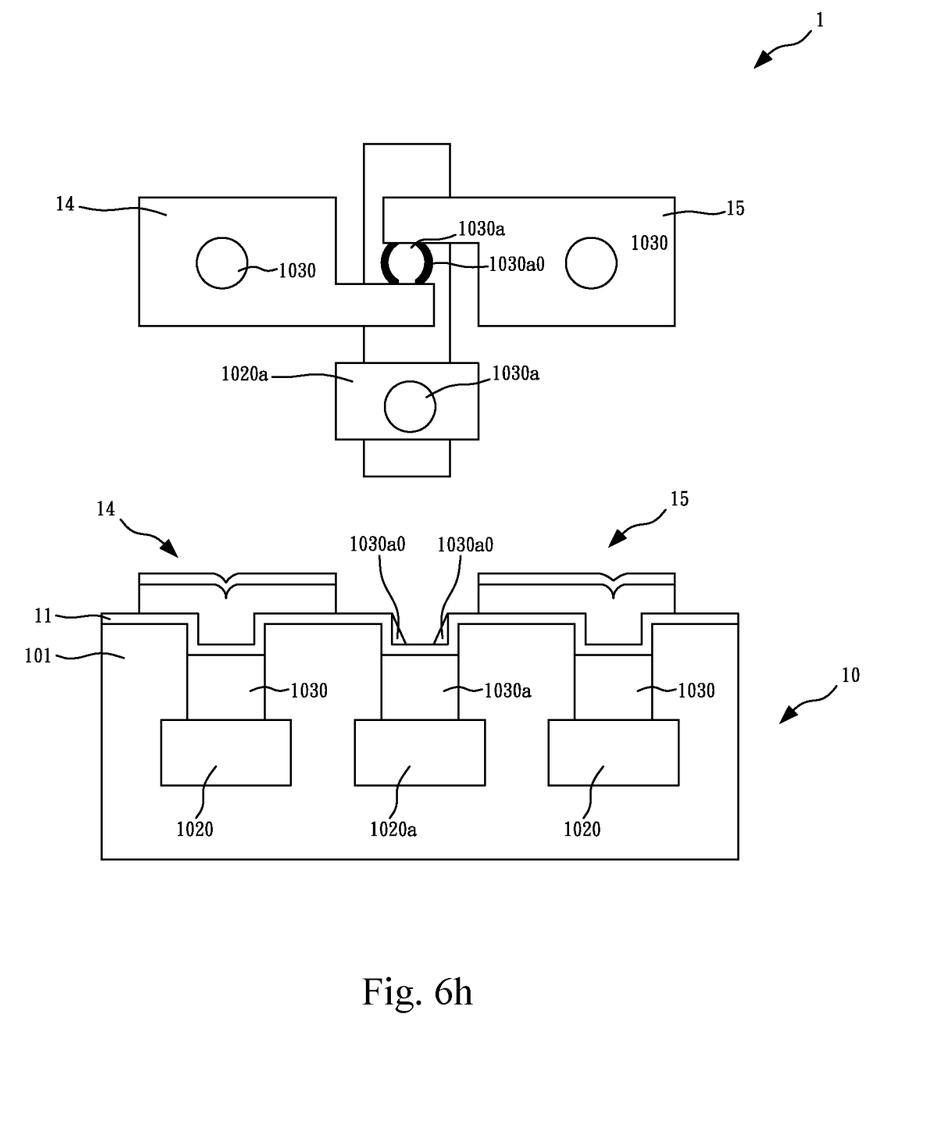
FIG. 6h is a perspective view of a step of activating the conduct layer under the source and the drain of the thin-film transistor in accordance with the present invention.

In step (207) of activating the conduct layer (13) under the source (14) and the drain (15) may be achieved by low temperature annealing, low temperature laser annealing or microwave annealing under 500° C.

The base (100) may comprise at least one complementary metal-oxide-semiconductor well (1000), at least one poly-silicon thin film transistor (1001), at least one shallow trench isolation unit (1002) and at least one contact channel (1003). The poly-silicon thin film transistor (1001) is stacked on the complementary metal-oxide-semiconductor well (1000). The shallow trench isolation unit (1002) separates the complementary metal-oxide-semiconductor well (1000) and separates the poly-silicon thin film transistor (1001). The contact channel (1003) connects one poly-silicon thin film transistor (1001) of the poly-silicon thin film transistors (1001) and a lowest metal wire layer (102) of the metal wire layers (102).

Figure 7:
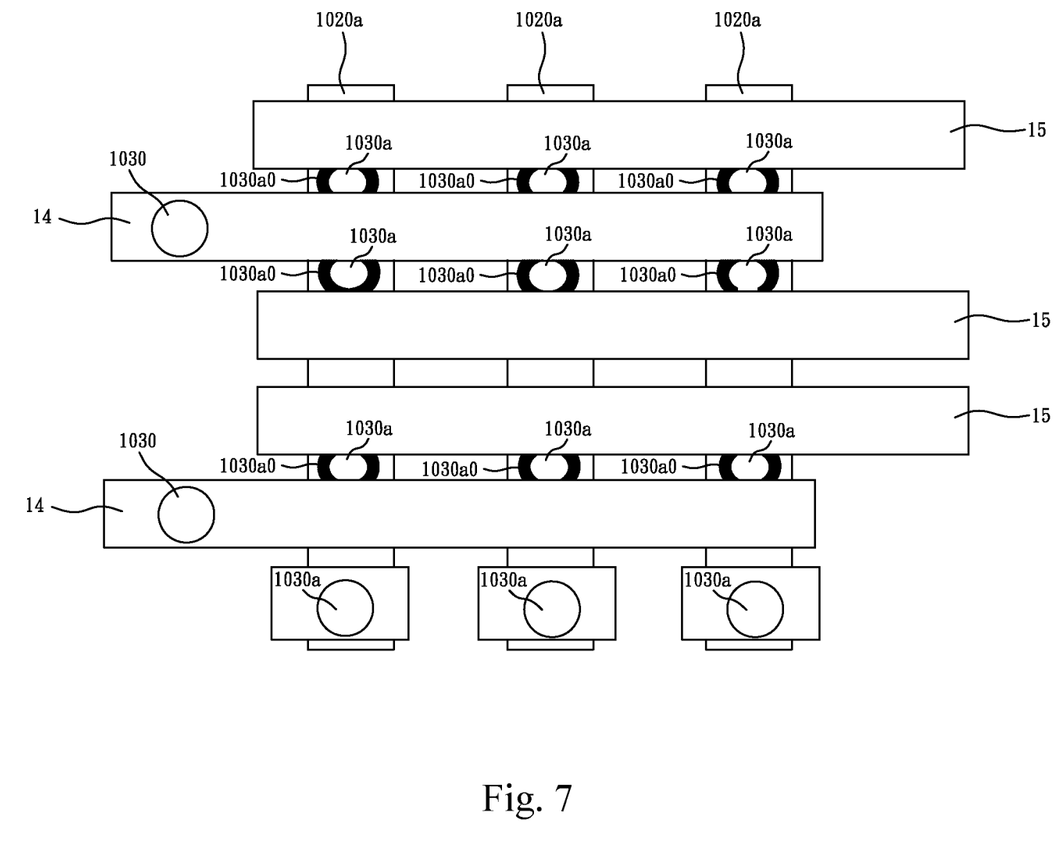
FIG. 7 is a perspective view of the thin-film transistor in accordance with the present invention applied in an element array structure.

With further reference to FIG. 7, the thin-film transistor (1) and the fabricating method for a thin-film transistor (2) can be applied in an element array structure. The element array structure comprises at least one ground line, at least one bit line, at least one byte line, at least one word line and multiple thin-film transistors (1). The ground line may be the source (14) or the drain (15). The bit line may be the drain (15) or the source (14) and have a signal. The word line may be the metal wire gate (1020a) and have a signal. The thin-film transistor (1) is selected and controlled by setting the signals of the bit lines and the word lines.

Various changes can be made without departing from the broad spirit and scope of the invention.

What is claimed is:

1. A fabricating method for a thin-film transistor being used in a semiconductor panel consisting of a base, an intra-dielectric layer, at least one metal wire layer, at least one via layer and a surface, the intra-dielectric layer being stacked on the base, the at least one metal wire layer comprising a lowest metal wire layer and at least one metal wire with multiple metal wires being separated by corresponding intra-dielectric layers, one metal wire of the metal wires is a metal wire gate, the at least one via layer being stacked on the at least one metal wire layer and comprising at least one via with multiple vias being separated by corresponding intra-dielectric layers, wherein each via being stacked on the one metal wire of the metal wires, of which one via being stacked on the metal wire gate being a gate via, comprising steps of:
   grinding the surface of the semiconductor panel;
   etching one via layer of the at least one via layer;
   stacking a dielectric layer on the semiconductor panel;
   stacking a semiconductor film layer on the dielectric layer;
   forming a conduct layer on the semiconductor film layer;
   defining a source zone and a drain zone each on a via of the vias that is adjacent to the gate via and connecting to the source zone, the drain zone and the gate via;
   forming two generally U-shaped nano-wire channels in the gate via respectively connecting the source to the drain along a plane parallel with the base; and
   activating the conduct layer under the source and the drain.

2. The fabricating method for a thin-film transistor as claimed in claim 1, wherein the base further comprises:
   at least one complementary metal-oxide-semiconductor well;
   at least one poly-silicon thin film transistor being stacked on the complementary metal-oxide-semiconductor well;
   at least one shallow trench isolation unit separating the complementary metal-oxide-semiconductor well and separating the at least one poly-silicon thin film transistor; and
   at least one contact channel connecting the at least one poly-silicon thin film transistor and the lowest metal wire layer.

3. The fabricating method for a thin-film transistor as claimed in claim 1, wherein the dielectric layer is selected from a group consisting of an oxide-nitride-oxide layer, an oxide layer, an oxide-nitride layer, a nitride layer and a high K layer.

4. The fabricating method for a thin-film transistor as claimed in claim 1, wherein the grinding step grinding the surface of the semiconductor panel is performed by chemical mechanical polishing.

5. The fabricating method for a thin-film transistor as claimed in claim 1, wherein stacking a semiconductor film layer step is performed by a technique selected from a group consisting of low temperature chemical vapor deposition and very high frequency plasma enhanced chemical vapor deposition (VHFPECVD).

6. The fabricating method for a thin-film transistor as claimed in claim 1, wherein the etching step is performed by over etching.

7. The fabricating method for a thin-film transistor as claimed in claim 1, wherein forming a conduct layer step is performed by a technique selected from a group consisting of ion doping, depositing a silicide layer and in-situ doping.

8. The fabricating method for a thin-film transistor as claimed in claim 1, wherein forming the source and the drain and forming the two nano-wire channels step is performed by forming two spacer nanowires in the gate via through dry etching.

9. The fabricating method for a thin-film transistor as claimed in claim 1, wherein the activating the conduct layer step is performed by low temperature annealing under 500° C.

10. The fabricating method for a thin-film transistor as claimed in claim 1, wherein the activating the conduct layer step is performed by low temperature laser annealing under 500° C.

11. The fabricating method for a thin-film transistor as claimed in claim 1, wherein the semiconductor film layer is selected from a group consisting of silicon film layer, germanium film layer and silicon-germanium film layer.

12. A method for fabricating a thin-film transistor, wherein a gate via is electrically connected to a metal wire gate and formed in an intra-dielectric layer stacked on a substrate, the method comprising:
    etching the gate via to form a gate recess between the gate via and a surface of the intra-dielectric layer;
    forming a dielectric layer, a semiconductor film layer, and a conductor layer on the gate recess and the intra-dielectric layer;
    forming a source pad and a drain pad adjacent to the gate recess by etching the conductor layer and the semiconductor film layer adjacent to the gate recess; and etching a portion of the conductor layer and the semiconductor film layer on the dielectric layer of the gate recess to form a first nano-wire channel and a second nano-wire channel connected between the source pad and the drain pad along a plane parallel with the substrate, wherein the first nano-wire channel and the second nano-wire channel are generally U-shaped and located in the gate via on two opposite sides of the gate recess.

13. The method for fabricating a thin-film transistor as claimed in claim 12, further comprises activating the conduct layer under the source pad and the drain pad by low temperature annealing, low temperature laser annealing or microwave annealing under 500° C.

14. The method for fabricating a thin-film transistor as claimed in claim 12, wherein the first nano-wire channel and the second nano-wire channel are spacer nano-wires.

15. The method for fabricating a thin-film transistor as claimed in claim 12, wherein the semiconductor film layer is selected from a group consisting of silicon film layer, germanium film layer and silicon-germanium film layer.

16. The method for fabricating a thin-film transistor as claimed in claim 12, wherein the dielectric layer is selected from a group consisting of an oxide-nitride-oxide layer, an oxide layer, an oxide-nitride layer, a nitride layer and a high K layer.

17. A method for fabricating a thin-film transistor, wherein a gate via is electrically connected to a metal wire gate and formed in an intra-dielectric layer stacked on a substrate, the method comprising:
    etching the gate via to form a gate recess between the gate via and a surface of the intra-dielectric layer;
    forming a dielectric layer, a semiconductor film layer, and a conductor layer on the gate recess and the intra-dielectric layer; and
    etching a portion of the conductor layer and the semiconductor film layer on the dielectric layer of the gate recess to form a first nano-wire channel and a second nano-wire channel connected between a source pad and the drain pad adjacent to the gate recess and along a plane parallel with the substrate;
    wherein the first nano-wire channel and the second nano-wire channel are generally U-shaped and located in the gate via on two opposite sides of the gate recess.

18. The method for fabricating a thin-film transistor as claimed in claim 17, wherein the method further comprises:
    forming the source pad and the drain pad by patterned etching the conductor layer and the semiconductor film layer adjacent to the gate recess.

19. The method for fabricating a thin-film transistor as claimed in claim 17, further comprises activating the conduct layer under the source pad and the drain pad by low temperature annealing, low temperature laser annealing or microwave annealing under 500° C.

20. The method for fabricating a thin-film transistor as claimed in claim 17, wherein the first nano-wire channel and the second nano-wire channel are spacer nano-wires.

* * * * *